United States Patent [19]

Cho et al.

[11] Patent Number: 5,753,544
[45] Date of Patent: May 19, 1998

[54] CRYSTALLIZATION PROCESS AND METHOD OF MANUFACTURING THIN FILM TRANSISTOR USING SAME

[75] Inventors: Won Ju Cho, Chungcheongbuk-do; Jae Sung Roh, Kyungki-do, both of Rep. of Korea

[73] Assignee: LG Semicon Co., Ltd., Chungcheongbuk-Do, Rep. of Korea

[21] Appl. No.: 499,255

[22] Filed: Jul. 7, 1995

[30] Foreign Application Priority Data

Jul. 7, 1994 [KR] Rep. of Korea ............... 16372/1994
Jul. 21, 1994 [KR] Rep. of Korea ............... 17685/1994

[51] Int. Cl.$^6$ ........................................ H01L 21/00
[52] U.S. Cl. ................................... 438/166; 438/486
[58] Field of Search .................... 437/26, 40 T, 46; 438/166; 1/483, 487

[56] References Cited

U.S. PATENT DOCUMENTS

| | | | |
|---|---|---|---|
| 4,904,611 | 2/1990 | Chiang | 437/21 |
| 5,290,712 | 3/1994 | Sato | 437/24 |
| 5,373,803 | 12/1994 | Noguchi | 117/8 |
| 5,457,058 | 10/1995 | Yonehara | 437/24 |

OTHER PUBLICATIONS

"High Performance Polysilicon Thin Flim Transistors". Mitra. U. et al. Mat. Res. Soc. Symp. Proc., vol. 182. pp. 381–386. 1990. Month not available.

"A Stacked–Cons Cell Technology for High–Density SRAM,s". Uemoto. Y. et al., IEEE Transactions On Electron Devices. vol. 39. No. 10. pp. 2359–2363. Oct 1992.

"High Reliability and High Performance 0.35 μm Gate–Inverted TFT,s for 16Mbit SRAM Application Using Self–Aligned LDD Structures". Liu. C.T. et al., 92 IEDM. pp. 823–826. 1992. Month Not Available.

*Primary Examiner*—John Niebling
*Assistant Examiner*—Brendan Mee
*Attorney, Agent, or Firm*—Morgan, Lewis, & Bockius Lip

[57] ABSTRACT

A crystallization process comprising the steps of depositing a polycrystalline silicon layer on a semiconductor substrate, implanting silicon ions into first and second areas of the polycrystalline silicon layer in different amounts such that crystals having a predetermined plane direction remain in the second area and such that the first area becomes amorphous, and performing a thermal treatment to recrystallize the amorphous second area using the crystals having the predetermined plane direction remaining in the first area as a nucleus.

18 Claims, 9 Drawing Sheets

F. I G. 3
prior art
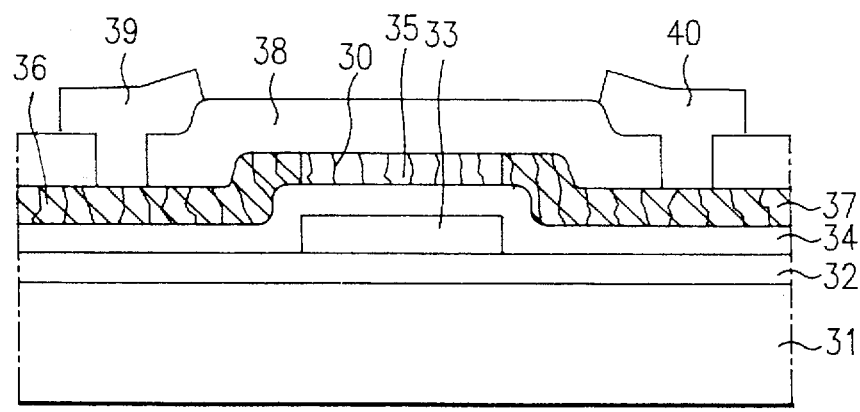

→ : recrystallization direction

→ : recrystallization direction

→ : recrystallization direction

CRYSTALLIZATION PROCESS AND METHOD OF MANUFACTURING THIN FILM TRANSISTOR USING SAME

BACKGROUND OF THE INVENTION

1. Field of the Invention

The present invention relates to a crystallization process. The present invention further relates to a method of manufacturing a thin film transistor using the crystallization process.

2. Discussion of the Related Art

For the conventional technology of forming a polycrystalline silicon layer, there are two methods: one is to deposit it with ordinary chemical vapor deposition (CVD), and the other is to deposit and solid-state crystallize an amorphous silicon layer thereby forming a polycrystalline silicon layer having large-sized grains.

The polycrystalline silicon layer deposited by the ordinary CVD method has small-sized grains, thereby reducing the characteristics of a device with which it is used. In order to solve this problem, a method has been proposed in which an amorphous silicon layer is deposited and thermally treated at a low temperature to thereby form a polycrystalline silicon layer having grains larger than those of the polycrystalline silicon layer deposited by the ordinary CVD method. However, despite the increased size of grains, a crystal nucleus must be generated and thermally treated for a long time in order to form the polycrystalline silicon layer.

FIG. 1 is a cross-sectional view of a thin film transistor using a polycrystalline silicon layer deposited by the CVD method. As shown FIG. 1, in the polycrystalline thin film transistor, an insulating layer 12 is formed on a silicon substrate 11. A polycrystalline silicon layer 13 is deposited on insulating layer 12. A gate insulating layer and gate 15 are formed on polycrystalline silicon layer 13. Using them as a mask, an impurity is ion-implanted into polycrystalline silicon layer 13 to thereby form source and drain regions 16 and 17. Here, polycrystalline silicon layer 13 placed between source and drain regions 16 and 17 and into which the impurity is not ion-implanted, acts as the channel area of the thin film transistor.

Insulating layer 18 is formed on the overall surface of the substrate. The insulating layer placed above source and drain regions 16 and 17 is removed to form a contact. Source and drain electrodes 19 and 20 are formed to come into contact with source and drain regions 16 and 17 via the contact. By doing such, the conventional polycrystalline silicon thin film transistor is fabricated.

FIG. 3 is a cross-sectional view of an amorphous silicon thin film transistor. Referring to FIG. 3, an insulating layer 32 is formed on a silicon substrate 31. A gate 33 is formed on insulating layer 32. A gate insulating layer 34 is formed on insulating layer 32 including gate 33. An amorphous silicon layer is deposited on gate insulating layer 34. The deposited amorphous silicon layer is solid-state crystallized through a low-temperature thermal treatment, to thereby form a polycrystalline silicon layer 35. An impurity is ion-implanted into polycrystalline silicon layer 35 placed on both sides of the gate thereby forming source and drain regions 36 and 37. An insulating layer 38 is formed on the entire surface of the substrate. The insulating layer placed above source and drain regions 36 and 37 is removed to form a contact. Source and drain electrodes 39 and 40 coming into contact with source and drain regions 36 and 37 are formed on insulating layer 38 through a contact thereby fabricating the conventional amorphous silicon thin film transistor. In FIG. 3, reference numeral 30 is a grain boundary.

Thin film transistors using the polycrystalline silicon layer deposited by the CVD method and the polycrystalline silicon layer obtained through solid-state crystallization have the following drawbacks. Because of the miniaturization and high packing density of devices, grain size and grain boundary affect the devices' electrical characteristics. In the case of the thin film transistor using the polycrystalline silicon layer deposited by the ordinary CVD method, since the grains of the polycrystalline silicon layer are small, a lot of grain boundaries are present in the channel area, as shown in FIG. 2 which show grains 9 and grain boundaries 8 of the polycrystalline silicon layer of FIG. 1.

The grain boundaries present in the channel area have a significant influence on the thin film transistor's electrical characteristics. Specifically, in the ON mode, a lot of current must flow through a thin film transistor. However, due to the serial resistance of the grain boundaries, the ON current is limited in the ON mode. Meanwhile, in the OFF mode in which currents must not flow, the OFF currents are increased due to the leakage current produced in the trap level present at the grain boundaries at a high density. As a result, the ON/OFF current ratio is reduced in the thin film transistor.

In the case of the thin film transistor using the polycrystalline silicon layer obtained through the solid-state crystallization, this polycrystalline silicon layer has a grain size greater than that of the polycrystalline silicon layer formed by the CVD method, but cannot control the position of the grain boundary. If the grain boundary of the polycrystalline silicon layer is formed in the drain area near the channel area, the OFF current cannot be reduced.

SUMMARY OF THE INVENTION

The present invention has been made in view of the above circumstances and has as an object to provide a crystallization which is capable of controlling the size of grains and the position of the grain boundaries.

A further object of the present invention is to provide a method of fabricating a thin film transistor using a crystallization for improving the ON/OFF current ratio and switching speed.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects in accordance with the purpose of the invention, as embodied and broadly described herein, a crystallization process is provided comprising the steps of: depositing a polycrystalline silicon layer on a semiconductor substrate, implanting silicon ions into first and second areas of the polycrystalline silicon layer in different amounts such that crystals having a predetermined plane direction remain in the second area and such that the first area becomes amorphous, performing a thermal treatment to recrystallize the amorphous second area using the crystals having the predetermined plane direction remaining in the first area as a nucleus.

To further achieve the objects and in accordance with the purpose of the invention, as embodied and broadly described herein, a method of manufacturing a thin film transistor is also provided comprising the steps of: forming a gate on a substrate; forming a gate insulating layer on the substrate including the gate, forming a polycrystalline silicon layer on the gate insulating layer, forming a mask layer on the polycrystalline silicon layer above the gate, implanting silicon ions using the mask layer such that at least a portion of the polycrystalline silicon layer above the gate becomes amorphous and crystals having a predetermined plane direction remain in other portions of the polycrystalline silicon layer, implanting an impurity using the mask layer to form a source area and a drain area, removing the mask layer, recrystallizing the amorphous area above the gate using the crystals having the predetermined plane direction as a nucleus, and forming a source electrode on the source area and a drain electrode on the drain area.

BRIEF DESCRIPTION OF THE ATTACHED DRAWINGS

The accompanying drawings, which are incorporated in and constitute a part of this specification, illustrate embodiments of the invention and, together with the description, serve to explain the objects, advantages and principles of the invention. In the drawings:

FIG. 3 is a cross-sectional view of a conventional amorphous silicon thin film transistor;

DETAILED DESCRIPTION OF THE INVENTION

Hereinafter, preferred embodiments of the present invention will be described with reference to the attached drawings.

In the preferred embodiments of the present invention, a polycrystalline silicon layer is divided into two areas. Silicon ions are implanted into the two areas in different amounts. In one of the two areas, only crystals having a predetermined plane direction are left. The other area becomes amorphous. Both areas are exposed to a thermal treatment so that the remaining crystals in the one area are taken as the nucleus to recrystallize the amorphous area. This controls the size of grains and the position of grain boundaries. FIGS. 4A–4E illustrate a crystallization process in which the size of grains and the position of grain boundaries can be controlled according to the first embodiment of the present invention. FIGS. 5A–5E show the crystal states of the polycrystalline silicon layer after the respective processes of FIGS. 4A–4E.

Figure 1:
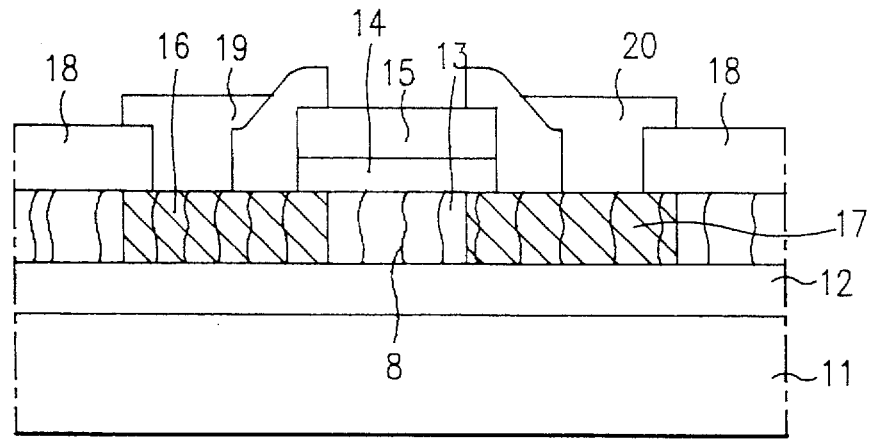
FIG. 1 is a cross-sectional view of a conventional polycrystalline silicon thin film transistor.
Figure 2:
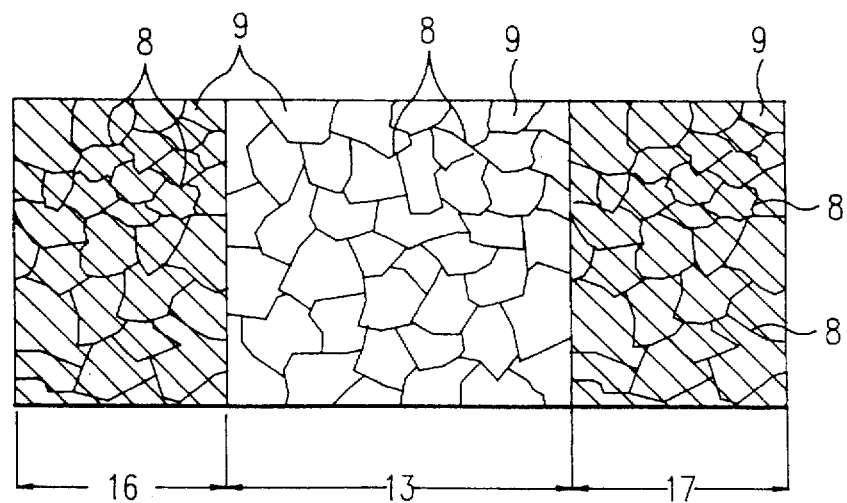
FIG. 2 is a diagram of crystals of the polycrystalline silicon layer of the thin film transistor of FIG. 1.
Figure 4A:
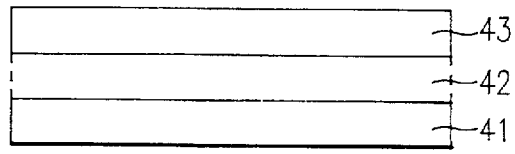
FIGS. 4A–4E are diagrams for explaining the first embodiment of the crystallization of the present invention.
Figure 5A:
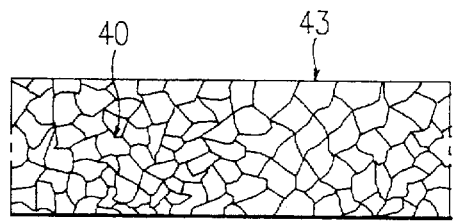
FIGS. 5A–5E are diagrams illustrating the states of the polycrystalline silicon layer after the respective processes of FIGS. 4A–4E.

First, referring to FIGS. 4A and 5A, an insulating layer 42 is formed on a substrate 41. A polycrystalline silicon layer 43 is deposited on insulating layer 42. In FIG. 5A it is noted that a lot of grain boundaries are present in polycrystalline silicon layer 43 deposited in the CVD.

Figure 4B:
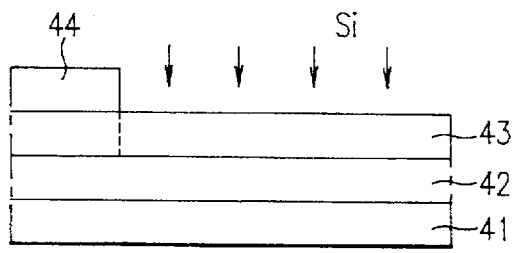
Figure 5B:
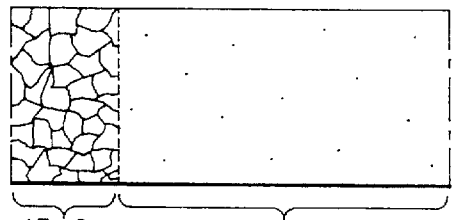

In FIGS. 4B and 5B, a first ion-implantation mask layer 44 is formed on polycrystalline silicon layer 43 and selectively etched to only partially expose polycrystalline silicon layer 43 as shown.

Using the first ion-implantation mask layer 44, $3\times10^{20}$ atoms/cm$^2$ of silicon ions are implanted into the exposed portions of the polycrystalline silicon layer 43 to produce an amorphous area 43-1.

Figure 4C:
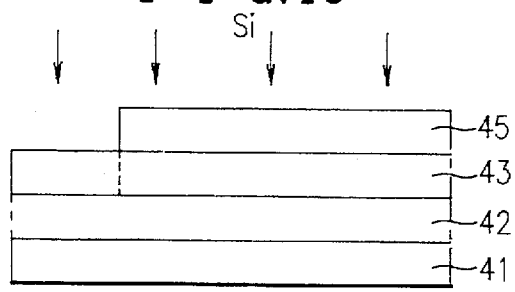
Figure 5C:
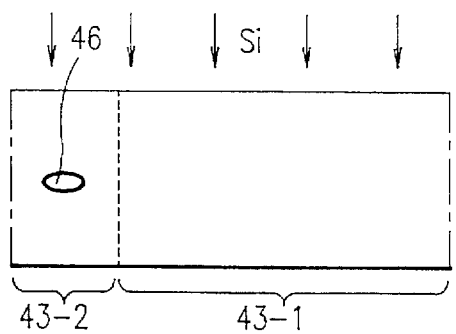

Turning to FIGS. 4C and 5C, the first ion-implantation mask layer 44 is removed, and then a second ion-implantation mask layer 45 is formed on the polycrystalline silicon layer 43 and selectively etched so as to remain only on the amorphous area 43-1.

Using ion-implantation mask layer 45, $1\times10^2$ atoms/cm$^2$ of silicon ions are implanted into the exposed area of the polycrystalline silicon layer 43 to produce an area 43-2 where only crystals 46 in the direction of the (110) plane remain and all crystals in other plane directions are destroyed.

Figure 4D:
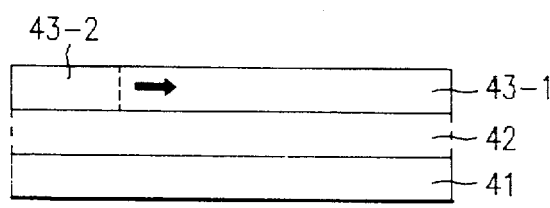
Figure 5D:
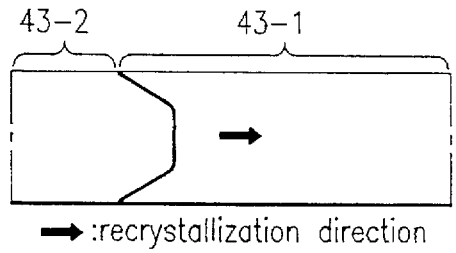
Figure 4E:
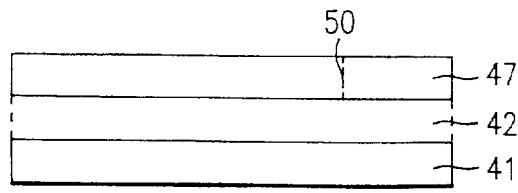
Figure 5E:
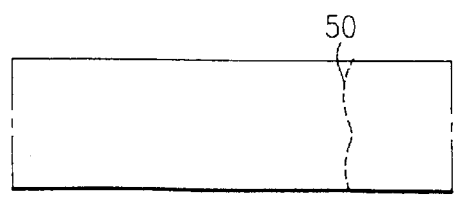

In FIGS. 4D and 4E, second ion-implantation mask layer 45 is removed. Thereafter, a thermal treatment is performed for 12 hours at 600° C. in a nitride atmosphere, thereby recrystallizing amorphous area 43-1. As shown in FIG. 5D, through this thermal treatment, recrystallization proceeds quickly in the direction of the arrow from crystals 46 in area 43-2 and having a plane direction (110). The result is a polycrystalline silicon layer 47 having one grain boundary 50, as shown in FIG. 5E.

In the first embodiment, recrystallization of the polycrystalline silicon is carried out in only one direction, as shown in FIG. 5D. However, it is also possible to perform the thermal treatment in the state in which only the center portion of the polycrystalline silicon layer 43 becomes amorphous and crystals having plane direction (110) are left on both sides of the amorphous area. By doing so, recrystallization is performed in two directions, namely, from the peripheral areas to the center portion of the polycrystalline silicon layer.

FIGS. 6A–6E illustrate a second embodiment of the present invention in which the size of grains and the position of grain boundaries can be controlled. FIGS. 7A–7E illustrate the crystal states of the polycrystalline silicon layer after the respective processes of FIGS. 6A–6E.

As discussed above, in the first embodiment, two masking and two ion-implantation processes are performed in order to ion-implant different amounts of silicon ions into the two areas of the polycrystalline silicon layer 43. In the second embodiment, only one masking process and one ion-implementation process are carried out.

Figure 6A:
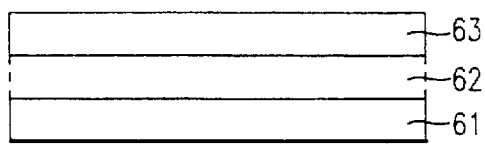
FIGS. 6A–6E are diagrams which detail the crystallization in accordance with the second embodiment of the present invention.
Figure 7A:
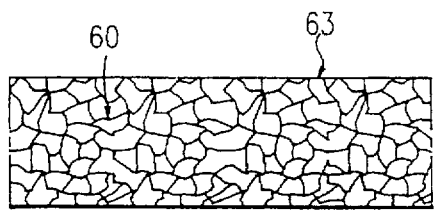
FIGS. 7A–7E are diagrams illustrating the states of the polycrystalline silicon layer after the respective processes of FIGS. 6A–6E.

First, in FIGS. 6A and 7A, an insulating layer 62 is formed on a substrate 61. A polycrystalline silicon layer 63 is deposited on insulating layer 62.

Figure 6B:
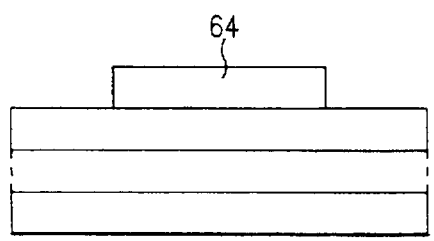
Figure 7B:
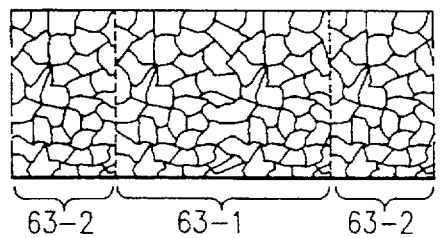

Referring to FIGS. 6B and 7B, a 1,000 Å-thick high-temperature oxide layer 64 is deposited as an ion-implantation mask layer on polycrystalline silicon layer 63 by CVD and selectively etched to expose two portions of polycrystalline silicon layer 63 on both sides of polycrystalline silicon layer 64.

Figure 6C:
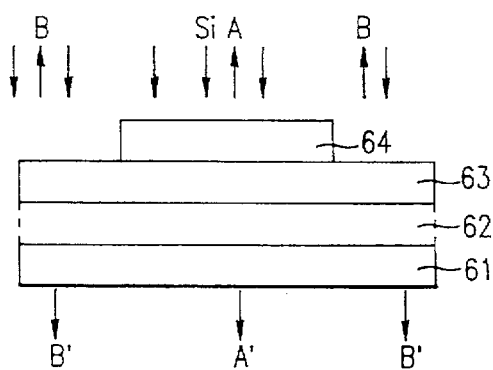
Figure 7C:
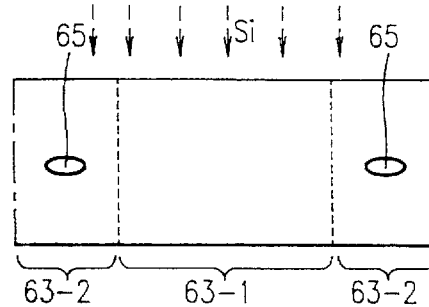
Figure 8A:
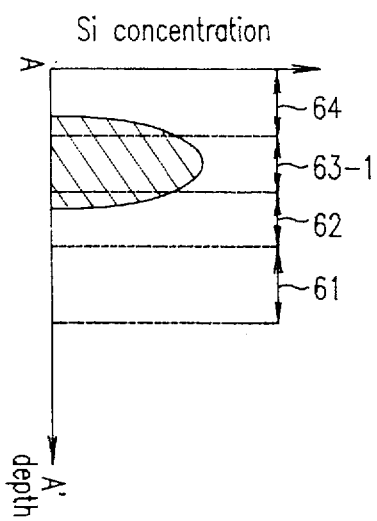
FIGS. 8A and 8B are diagrams illustrating concentration of silicon ions in accordance with depth in the directions of A-A' and B-B' of FIG. 6C.

In FIGS. 6C and 7C, silicon ions are implanted vertically into polycrystalline silicon layer 63 at 100 KeV. After the implantation of silicon ions, in the cross-section along line A-A', the peak of the silicon ions is located at a portion 63-1 under high-temperature oxide layer 64 of the polycrystalline silicon layer because of the high-temperature oxide layer 64, as shown in FIG. 8A. Thus, portion 63-1 becomes completely amorphous.

Figure 8B:
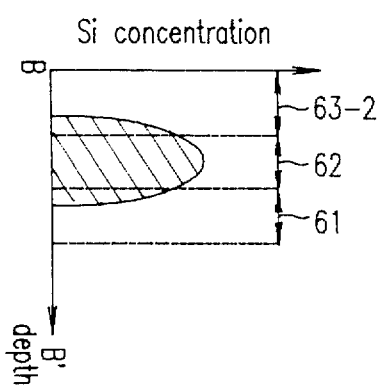

Meanwhile, in the cross-section along line B-B', high-temperature oxide layer 64 is not present so that the peak of the silicon ions is located on insulting layer 62 under the polycrystalline silicon layer, as shown in FIG. 8B. Therefore, in area 63-2 where the high-temperature oxide layer is not formed, ion channelling takes place so that only crystals 65 along plane direction (110) exist and crystals having other plane directions are all destroyed.

Figure 6D:
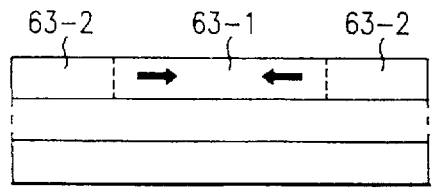
Figure 6E:
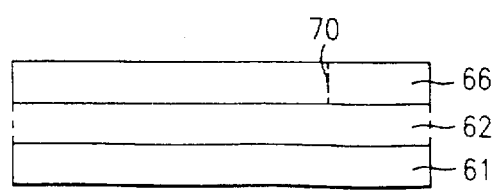
Figure 7D:
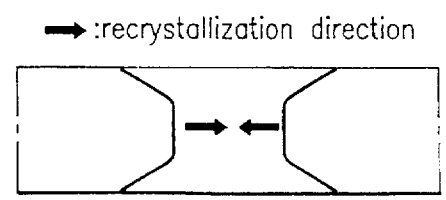
Figure 7E:
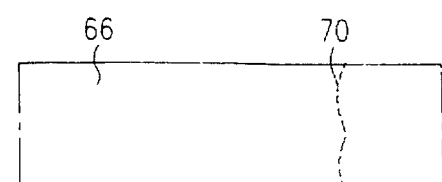

Referring to FIGS. 6D and 6E, high-temperature oxide layer 64 is removed. Then, a thermal treatment is performed for 12 hours at 600° C. in a nitride atmosphere so that the crystals are recrystallized into the polycrystalline silicon layer 66 having one grain boundary. Throughout the thermal treatment, recrystallization is carried out quickly in the direction of the arrow from peripheral areas 63-2 to center portion 63-1 using crystals 65 having a (110) plane direction as the nucleus and remaining in areas 63-2, as shown in FIG. 7D. The result is a polycrystalline silicon layer 66 having one grain boundary as shown in FIG. 7E.

In the second embodiment, recrystallization is carried out from the peripheral area to the center portion of the polycrystalline silicon layer, as shown in FIG. 7D. However, recrystallization may be performed in only one direction as was the case with the first embodiment.

The crystallization process in which the crystals having plane direction (110) are taken as the nucleus in recrystallizing the polycrystalline silicon layer has the following advantages, as compared with the crystallization performed in a fully amorphous condition. First, since a crystal nucleus having plane direction (110) is present in recrystallization, there is no energy or latent period needed to produce the nucleus, thereby shortening the time to crystallize. Second, recrystallization is performed centering on the crystal nucleus having plane direction (110) so that the matching characteristics between grains is good, thereby reducing trap level at the grain boundary.

A method of manufacturing a thin film transistor using the crystallization process of the present invention will now be explained with reference to FIGS. 9A–9F and 10A–10H.

Figure 9A:
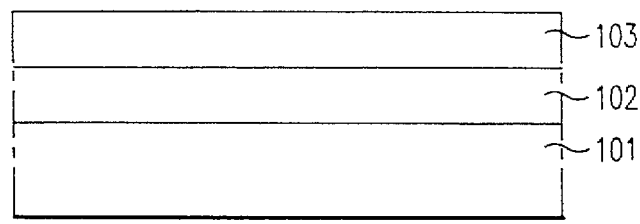
FIGS. 9A–9F are diagrams illustrating the fabrication process of a thin film transistor in accordance with the first embodiment of the present invention.

Referring to FIG. 9A, with insulating layer 102, an oxide layer is formed on silicon substrate 101. Polycrystalline silicon layer 103 is deposited on silicon substrate 101.

Figure 9B:
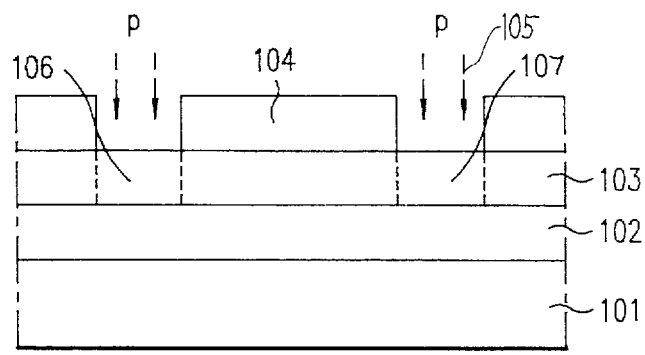

In FIG. 9B, first ion-implantation mask layer 104 is formed on polycrystalline silicon layer 103 except where source and drain areas are to be formed. Using first ion-implantation mask layer 104, an impurity, for instance, P, is implanted into exposed polycrystalline silicon layer 103 and activated through a thermal treatment, to thereby form source and drain areas 107 and 106.

Figure 9C:
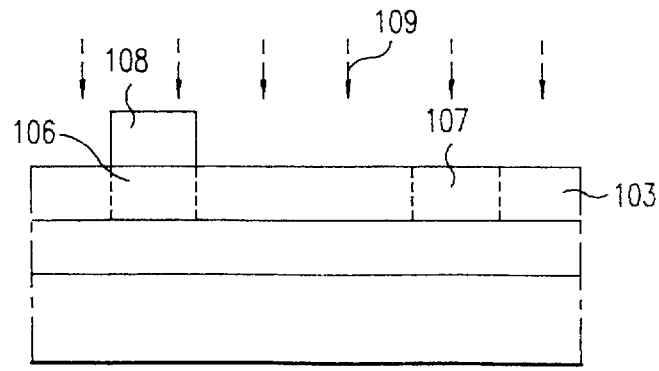

Referring to FIG. 9C, after removing first ion-implantation mask layer 104, second ion-implantation mask layer 108 is formed on polycrystalline silicon layer 103 and etched except on drain area 106. Using second ion-implantation mask layer 108, $3 \times 10^{20}$ atoms/cm² of silicon ions 109 are selectively implanted into polycrystalline silicon layer 103 excluding drain area 106, which becomes amorphous.

Figure 9D:
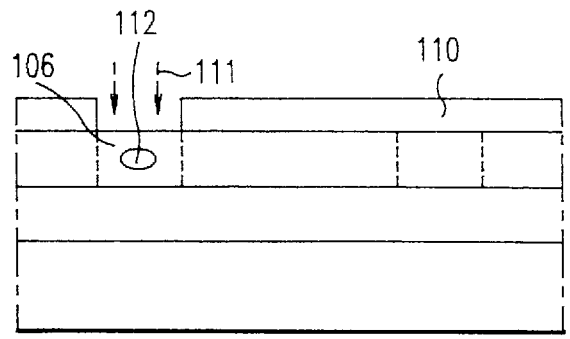

In FIG. 9D, after second ion-implantation mask layer 108 is removed, third ion-implantation mask layer 110 is formed on polycrystalline silicon layer 103 except on drain area 106. Using third ion-implantation mask layer 11, $1 \times 10^{20}$ atoms/cm² of silicon ions 111 are selectively implanted into drain area 106 so that crystals 112 having plane direction (110) are left and crystals having other plane directions are destroyed in drain area 106.

Figure 9E:
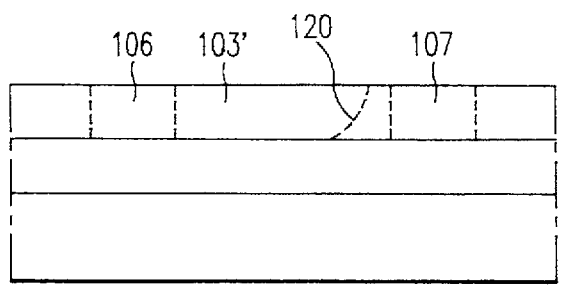

Referring to FIG. 9E, after third ion-implantation mask layer is removed, a thermal treatment is performed, whereby crystals 112 left in drain area 106 are used as the nucleus so that the amorphous region is recrystallized. As a result, grain boundary 120 is formed between the source and drain areas 107 and 106, that is, in channel area 103'.

Figure 9F:
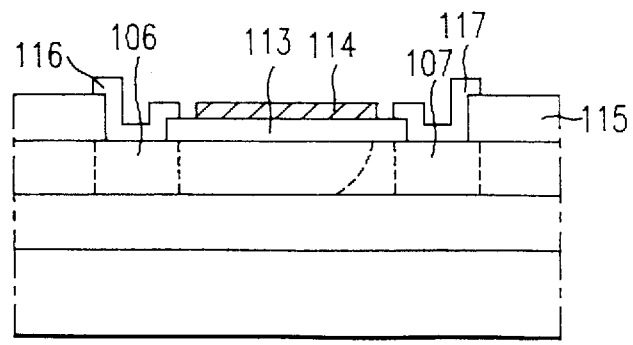

In FIG. 9F, gate insulating layer 113 and gate 114 are formed in channel area 103'. Insulating layer 115 is formed on the overall surface of the substrate and patterned so that a contact is formed on source and drain areas 107 and 106. Finally, source and drain electrodes 117 and 116 coming into contact with source and drain areas 107 and 106 through the contact are formed, to thereby obtain a thin film transistor.

Another method of manufacturing a thin film transistor using the crystallization process of the present invention will now be described with reference to FIGS. 10A–10H.

Figure 10A:
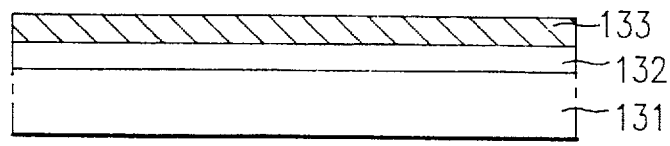
FIGS. 10A–10H are diagrams illustrating the fabrication process of a thin film transistor in accordance with the second embodiment of the present invention.

Referring to FIG. 10A, an oxide layer is formed with insulating layer 132 on semiconductor substrate 131. Doped polycrystalline silicon layer 133 is deposited thereon with a thickness of 1,000 Å.

Figure 10B:
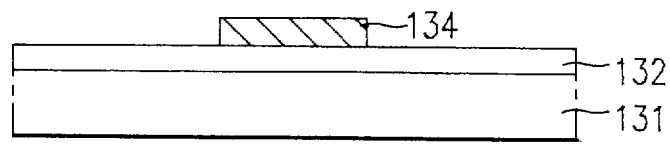

In FIG. 10B, the doped polycrystalline silicon layer 133 is etched in a predetermined pattern, to thereby form gate 134.

Figure 10C:
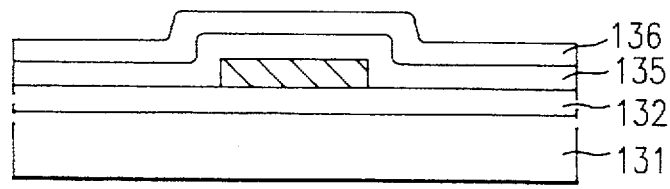

Referring to FIG. 10C, gate insulating layer 135 and polycrystalline silicon layer 136 are sequentially formed on insulating layer 132 including gate 134. Here, gate insulating layer 135 is formed with a 400 Å-thick oxide layer such as a hightemperature oxide. Polycrystalline silicon layer 136 is formed with a thickness of 100–200 Å. When polycrystalline silicon layer 136 is deposited at 620° C., its deposition speed is increased. Polycrystalline silicon layer 136 is formed thin in order to reduce reverse current. As the deposition thickness of the layer becomes thinner, the section of pn junction made with the source and drain areas and substrate is reduced thereby decreasing the reverse leakage current.

Figure 10D:
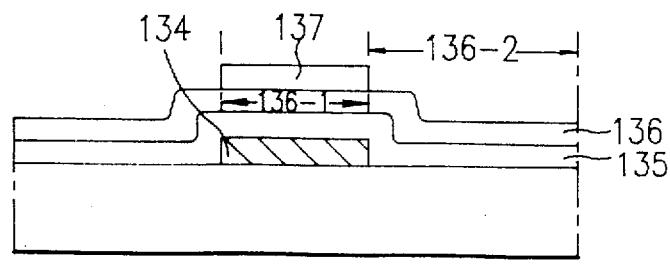

Referring to FIG. 10D, high-temperature oxide layer 137 is formed on polycrystalline silicon layer 136 with a thickness of 1000 Å by CVD and selectively etched to be left only above gate 134. Here, polycrystalline silicon layer 136, with a portion under high-temperature oxide layer 137, will become the channel region of the thin film transistor. The exposed portion will become the source and drain areas.

Figure 10E:
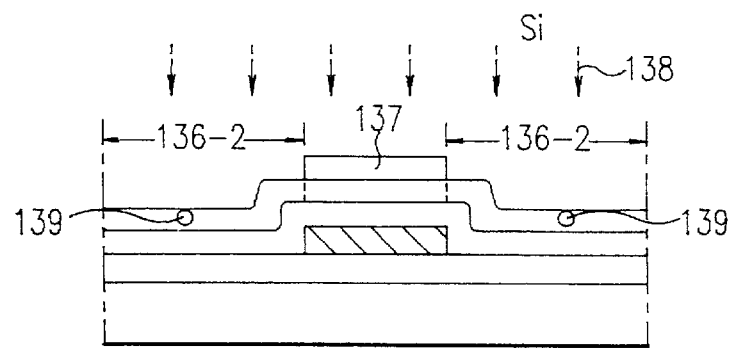

Turning to FIG. 10E, $5 \times 10^{14}$ atoms/cm² of silicon ions 138 are vertically implanted at 100 KeV so that a portion 136-1 above high-temperature oxide layer 137 of the polycrystalline silicon layer becomes completely amorphous. In the exposed area 136-2 where high-temperature oxide layer 137 is not formed, ion channelling takes place so that only crystals 140 having plane direction (110) are left and crystals having other plane directions are destroyed.

Figure 10F:
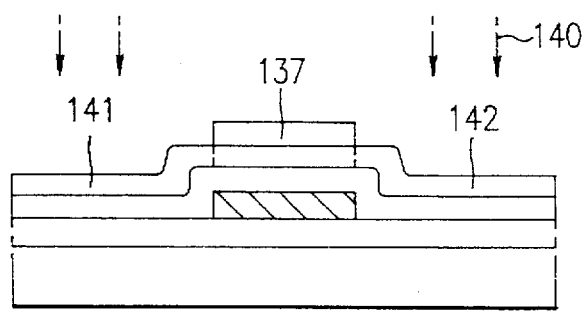

In FIG. 10F, using high-temperature oxide layer 137 as a mask, an impurity, for instance, $3 \times 10^{14}$ atoms/cm² of boron, is implanted at 10 KeV, thereby forming source and drain areas 141 and 142.

Figure 10G:
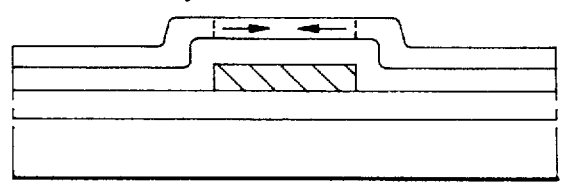
Figure 10H:
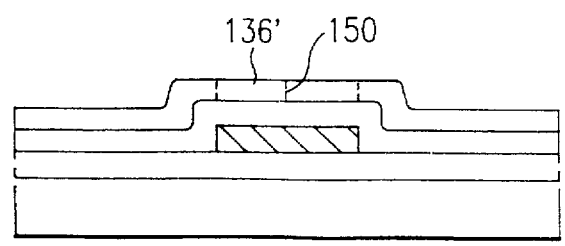

When remaining high-temperature oxide layer 137 is removed and a thermal treatment is performed for 12 hours at 600° C. under a nitride atmosphere, recrystallization is carried out in the direction of the arrow, as shown in FIG. 10G. The amorphous portion 136-1 is again recrystallized. Therefore, in channel area 136' between source and drain areas 141 and 142, grain boundary 150 is present, as shown in FIG. 10H.

In case the impurity area where the crystals are left is used as the drain area and the impurity area where the crystals are not left is used as the source and drain areas, the grain boundary is not formed around the surface of the drain and channel areas, preventing the increase of the off current. When source and drain electrodes are formed on the source and drain areas, the thin film transistor using the second embodiment of crystallization of the present invention is obtained.

In the thermal treatment for recrystallization in FIGS. 9A–10H, if the concentration of an impurity for the source and drain areas, for instance, phosphorus or boron, is high, the generation of a new crystal nucleus will be suppressed. However, the growth of the existing crystals becomes faster. In case that the crystals having plane direction (110) are left in the source and drain areas where the concentration of the impurity is high, similar to the above-stated crystallization, the crystals having plane direction (110) are grown faster than crystals having other plane directions. The crystals are grown centering on the drain area so that the grain boundary is not formed around the surface of the drain area and channel area, suppressing the increase of the OFF current.

As described above, the present invention controls the implantation amount and implantation position of silicon ions in recrystallizing the polycrystalline silicon layer. This obtains a polycrystalline silicon layer having large-sized grains. In the case of using the silicon layer in a thin film transistor, the number of grain boundaries, which affects the electrical characteristics of the thin film transistor, is reduced, and the position of the grain boundaries can be controlled. Accordingly, this invention obtains the ON/OFF current ratio greater than that of the thin film transistor using the conventional polycrystalline silicon layer deposited by CVD, and improves the switching speed thereby increasing the device's operating characteristics. The thin film transistor of the present invention can be employed as the load transistor of a high-density SRAM device over 1M.

Furthermore, the present invention is performed under the same conditions as those of the conventional process of manufacturing a thin film transistor, having a high reliability without changing the device's characteristics. In addition, the oxide layer above the channel area used as the ion-implantation mask is used as the mask in ion-implantation of impurity for forming the source and drain areas as well as to control the depth of implantation of silicon ions, simplifying the overall process.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A crystallization process comprising the steps of:
   depositing a polycrystalline silicon layer on a semiconductor substrate, the polycrystalline silicon layer having first and second areas;
   forming a first mask layer on the second area of the polycrystalline silicon layer;
   implanting silicon ions into the first area of the polycrystalline silicon layer using the first mask layer such that the first area becomes amorphous;
   forming a second mask layer on the first area of the polycrystalline silicon layer;
   implanting silicon ions into the second area of the polycrystalline silicon layer using the second mask layer such that crystals having a specific plane direction remain in the second area; and
   performing a thermal treatment to recrystallize the amorphous first area using the crystals having the specific plane direction remaining in the second area as a nuclei.

2. The crystallization process of claim 1, wherein the silicon ions are implanted into the first and second areas of the polycrystalline silicon layer in different amounts.

3. The crystallization process of claim 1, wherein the amount of silicon ions implanted into the second area of the polycrystalline silicon layer is $1 \times 10^{20}$ atoms/cm$^2$.

4. The crystallization process of claim 1, wherein the amount of silicon ions implanted into the first area of the polycrystalline silicon layer is $3 \times 10^{20}$ atoms/cm$^2$.

5. A crystallization process comprising the steps of:
   depositing a polycrystalline silicon layer on a semiconductor substrate, the polycrystalline silicon layer having first and second areas;
   forming a mask layer on the second area of the polycrystalline silicon layer;
   vertically implanting silicon ions into the polycrystalline silicon layer at an energy such that crystals having a specific plane direction remain in the first area and such that the second area becomes amorphous; and
   performing a thermal treatment to recrystallize the amorphous second area using the crystals having the specific plane direction remaining in the first area as a nucleus.

6. The crystallization process of claim 5, wherein the amount of silicon ions implanted into the polycrystalline silicon layer is $5 \times 10^{20}$ atoms/cm$^2$ at 100 KeV.

7. The crystallization process of claim 5, wherein the ion-implantation mask layer includes a high-temperature oxide layer.

8. The crystallization process of claim 7, wherein the high-temperature oxide layer controls the depth of silicon ion implantation into the polycrystalline silicon layer.

9. A method of manufacturing a thin film transistor comprising the steps of:
   depositing a polycrystalline silicon layer on a substrate;
   forming a first mask layer on the polycrystalline silicon layer;
   implanting an impurity into the polycrystalline silicon layer using the first mask layer to form a source area and a drain area;
   forming a second mask layer on the drain area of the polycrystalline silicon layer;
   implanting silicon ions into the polycrystalline silicon layer using the second mask layer such that at least a portion of the polycrystalline silicon layer except the drain area becomes amorphous;

forming a third mask layer on the polycrystalline silicon layer except on the drain area;

implanting silicon ions into the drain area using the third mask layer such that crystals having a specific plane direction remain in the drain area;

recrystallizing the amorphous area using the crystals having the specific plane direction remaining in the drain area as a nucleus;

forming a gate insulating layer and gate on the substrate; and forming a source electrode on the source area and a drain electrode on the drain area.

10. A method of manufacturing a thin film transistor comprising the steps of:

depositing a polycrystalline silicon layer on a substrate;

forming a first mask layer on the polycrystalline silicon layer;

implanting an impurity into the polycrystalline silicon layer using the first mask layer to form a source area and a drain area;

forming a second mask layer on the source area and drain area of the polycrystalline silicon layer;

implanting silicon ions into the polycrystalline silicon layer using the second mask layer such that at least portions of the polycrystalline layer except the source area and drain area become amorphous;

forming a third mask layer on the polycrystalline silicon layer except on the source area and drain area;

implanting silicon ions into the source area and drain area using the third mask layer such that crystals having a specific plane direction remain in the source area and drain area;

recrystallizing the amorphous area using the crystals having the specific plane direction remaining in the source area and drain area as a nucleus;

forming a gate insulating layer and gate on the substrate; and forming a source electrode on the source area and a drain electrode on the drain area.

11. A method of manufacturing a thin film transistor comprising the steps of:

forming a gate on a substrate;

forming a gate insulating layer on the substrate including the gate;

forming a polycrystalline silicon layer on the gate insulating layer;

forming a mask layer on the polycrystalline silicon layer above the gate;

implanting silicon ions using the mask layer such that at least a portion of the polycrystalline silicon layer above the gate becomes amorphous and crystals having a specific plane direction remain in other portions of the polycrystalline silicon layer;

implanting an impurity using the mask layer to form a source area and a drain area;

removing the mask layer;

recrystallizing the amorphous area above the gate using the crystals having the specific plane direction as a nucleus; and forming a source electrode on the source area and a drain electrode on the drain area.

12. The method of manufacturing a thin film transistor of claim 11, wherein the mask layer includes a high-temperature oxide layer.

13. The method of manufacturing a thin film transistor of claim 11, wherein the high-temperature oxide layer controls the depth of silicon ion implantation.

14. A crystallization process comprising the steps of:

forming a polycrystalline layer on a semiconductor substrate;

selectively implanting ions of a first dose into a first region of the polycrystalline layer, wherein the first region becomes amorphous;

implanting ions of a second dose into a second region excluding the first region of the polycrystalline layer in order to have crystals of a specific plane direction in the second region; and performing a thermal treatment to recrystallize the amorphous first region using the crystals having the specific plane direction remaining in the second region as nuclei.

15. The crystallization process of claim 14, wherein the first dose is greater than the second dose.

16. The crystallization process of claim 14, wherein the specific plane direction is (110).

17. The crystallization process of claim 14, wherein the first region of the polycrystalline layer is adjacent to the second region of the polycrystalline layer.

18. The crystallization process of claim 14, wherein the second region of the polycrystalline layer includes first and second portions, and wherein the first region of the polycrystalline layer is between the first and second portions of the second region of the polycrystalline layer.

* * * * *